(12) United States Patent
Hou et al.

(10) Patent No.: US 11,094,737 B2
(45) Date of Patent: Aug. 17, 2021

(54) FLAT PANEL DETECTOR

(71) Applicants: BEIJING BOE SENSOR TECHNOLOGY CO., LTD., Beijing (CN); BOE TECHNOLOGY GROUP CO., LTD., Beijing (CN)

(72) Inventors: Xuecheng Hou, Beijing (CN); Jianxing Shang, Beijing (CN); Xiaobin Shang, Beijing (CN); Xiaodong Li, Beijing (CN)

(73) Assignees: BEIJING BOE SENSOR TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/844,174

(22) Filed: Apr. 9, 2020

(65) Prior Publication Data
US 2021/0159262 A1 May 27, 2021

(30) Foreign Application Priority Data

Nov. 26, 2019 (CN) .......................... 201922065689.7

(51) Int. Cl.
  *G01T 1/20* (2006.01)
  *H01L 27/146* (2006.01)
  *H01L 31/08* (2006.01)
  *H04N 5/32* (2006.01)
  *H01L 31/18* (2006.01)

(52) U.S. Cl.
  CPC ...... *H01L 27/14663* (2013.01); *G01T 1/2018* (2013.01); *H01L 31/08* (2013.01); *H01L 31/18* (2013.01); *H04N 5/32* (2013.01)

(58) Field of Classification Search
  CPC ... H01L 27/14663; H01L 31/08; H01L 31/18; H04N 5/32; G01T 1/2018
  See application file for complete search history.

(56) References Cited

U.S. PATENT DOCUMENTS

| | | | |
|---|---|---|---|
| 9,093,341 B2* | 7/2015 | Ibuki | G01T 1/2006 |
| 10,109,667 B2* | 10/2018 | Kusumoto | H01L 27/14692 |
| 2004/0223587 A1* | 11/2004 | Tsujii | G01T 1/24 |
| | | | 378/97 |
| 2013/0168563 A1* | 7/2013 | Kim | G01T 1/16 |
| | | | 250/370.06 |
| 2015/0001377 A1* | 1/2015 | Tazoe | H01L 27/14641 |
| | | | 250/208.1 |

* cited by examiner

*Primary Examiner* — Kiho Kim
(74) *Attorney, Agent, or Firm* — Dilworth & Barrese, LLP.; Michael J. Musella, Esq.

(57) ABSTRACT

A flat panel detector includes: a substrate, a gate line and a read signal line define a detection region, a detection unit includes a first photoelectric converter, a thin film transistor and a second photoelectric converter, the first photoelectric converter and the second photoelectric converter are on two side of the thin film transistor and connected with it; a gate electrode layer of the thin film transistor is connected with the gate line, and a source electrode or a drain electrode of the thin film transistor is connected with the read signal line; a gap region is between the second photoelectric converter and at least one selected from a group consisting of the gate line defining the detection unit, the read signal line defining the detection unit and the thin film transistor, and an orthographic projection of the first photoelectric converter on the substrate at least covers the gap region.

20 Claims, 4 Drawing Sheets ic conversion layer close to the substrate, and a first upper electrode on a side of the first photoelectric conversion layer away from the substrate, and the first lower electrode is electrically connected with the first bias electrode by the first via hole.

For example, in the flat panel detector provided by at least an embodiment of the present disclosure, a material of the first upper electrode is a transparent conductive material.

For example, the flat panel detector provided by at least an embodiment of the present disclosure, further comprises a second insulation layer on a side of the first upper electrode away from the substrate.

For example, the flat panel detector provided by at least an embodiment of the present disclosure further comprises: a third insulation layer covering the second photoelectric converter, and a second bias electrode on a side of the second photoelectric converter away from the substrate; the second photoelectric converter comprises a second photoelectric conversion layer, a second lower electrode on a side of the second photoelectric conversion layer close to the substrate, and a second upper electrode on a side of the second photoelectric conversion layer away from the substrate, the third insulation layer has a second via hole exposing the second upper electrode, and the second bias electrode is electrically connected with the second upper electrode by the second via hole.

For example, in the flat panel detector provided by at least an embodiment of the present disclosure, a material of the second lower electrode is a transparent conductive material.

For example, in the flat panel detector provided by at least an embodiment of the present disclosure, the thin film transistor further comprises: a gate insulation layer on a side of the gate electrode layer away from the substrate, an active layer on a side of the gate insulation layer away from the substrate; the gate electrode layer is on a side of the second insulation layer away from the substrate; both the source electrode and the drain electrode are on a side of the active layer away from the substrate, and the source electrode and the drain electrode are respectively electrically connected with the active layer.

For example, in the flat panel detector provided by at least an embodiment of the present disclosure, the flat panel detector further comprises: a first passivation layer on the side of the active layer away from the substrate and on a side of the source electrode and the drain electrode away from the substrate; and the first passivation layer covers all the active layer, the source electrode and the drain electrode.

For example, the flat panel detector provided by at least an embodiment of the present disclosure further comprises: a fourth insulation layer between the first passivation layer and the second photoelectric converter, and a third passivation layer between the fourth insulation layer and the second photoelectric converter.

For example, in the flat panel detector provided by at least an embodiment of the present disclosure, a third via hole exposing the first upper electrode is in both the second insulation layer and the gate insulation layer, and one of the source electrode and the drain electrode is electrically connected with the first upper electrode of the first photoelectric converter by the third via hole; a fourth via hole exposing the one of the source electrode and the drain electrode is in both the fourth insulation layer and the third passivation layer, and the second lower electrode of the second photoelectric converter is electrically connected with the one of the source electrode and the drain electrode by the fourth via hole; and an orthographic projection of the third via hole on the substrate does not overlap with an orthographic projection of the fourth via hole on the substrate.

FLAT PANEL DETECTOR

CROSS-REFERENCE TO RELATED APPLICATION

The application claims priority to the Chinese patent application No. 201922065689.7, filed on Nov. 26, 2019, the entire disclosure of which is incorporated herein by reference as part of the present application.

TECHNICAL FIELD

At least one embodiment of the present disclosure relates to a flat panel detector.

BACKGROUND

The accuracy of reading data by a flat panel X-ray detector (FPXD) is very important. In order to improve the accuracy of reading data by the FPXD, it is necessary to ensure that the product has a higher signal-to-noise ratio, that is, the smaller the noise of the product, the better. Therefore, overlapping capacitances and parasitic capacitances should be avoided as much as possible when designing the product.

SUMMARY

At least one embodiment of the present disclosure provides a flat panel detector, and the flat panel detector comprises: a substrate, a gate line and a read signal line that are on the substrate; the gate line and the read signal line are insulated from each other and intersecting each other to define a detection region; the detection region is provided with a detection unit, and the detection unit comprises a first photoelectric converter, a thin film transistor and a second photoelectric converter, the first photoelectric converter is on a side of the thin film transistor close to the substrate, the second photoelectric converter is on a side of the thin film transistor facing away from the substrate, and both the first photoelectric converter and the second photoelectric converter are electrically connected with the thin film transistor; a gate electrode layer of the thin film transistor is electrically connected with the gate line, and a source electrode of the thin film transistor or a drain electrode of the thin film transistor is electrically connected with the read signal line; a gap region is between an orthographic projection of the second photoelectric converter on the substrate and at least one selected from a group consisting of an orthographic projection of the gate line defining the detection unit on the substrate, an orthographic projection of the read signal line defining the detection unit on the substrate and an orthographic projection of the thin film transistor on the substrate, and an orthographic projection of the first photoelectric converter on the substrate at least covers the gap region.

For example, the flat panel detector provided by at least an embodiment of the present disclosure further comprises: a first bias electrode on a side of the first photoelectric converter close to the substrate, and a first insulation layer between the first bias electrode and the first photoelectric converter; and the first insulation layer has a first via hole exposing the first bias electrode.

For example, in the flat panel detector provided by at least an embodiment of the present disclosure, the first photoelectric converter comprises a first photoelectric conversion layer, a first lower electrode on a side of the first photoelectric conversion layer close to the substrate, and a first upper For example, in the flat panel detector provided by at least an embodiment of the present disclosure, thin film transistor further comprises: an active layer on a side of the second insulation layer away from the substrate; and a gate insulation layer on a side of both the source electrode and the drain electrode away from the substrate; both the source electrode and the drain electrode are on a side of the active layer away from the substrate; the gate electrode layer is on a side of the gate insulation layer away from the substrate; and the source electrode and the drain electrode are respectively electrically connected with the active layer.

For example, the flat panel detector provided by at least an embodiment of the present disclosure further comprises: a second passivation layer on a side of the gate electrode layer away from the substrate, and the second passivation layer covers the gate electrode layer.

For example, the flat panel detector provided by at least an embodiment of the present disclosure further comprises: a fourth insulation layer and a third passivation layer that are between the second passivation layer and the second photoelectric converter.

For example, in the flat panel detector provided by at least an embodiment of the present disclosure, a third via hole exposing the first upper electrode is in the second insulation layer, and one of the source electrode and the drain electrode is electrically connected with the first upper electrode of the first photoelectric converter by the third via hole; a fourth via hole exposing the one of the source electrode and the drain electrode is in all the gate insulation layer, the second passivation layer, the fourth insulation layer and the third passivation layer, and the second lower electrode of the second photoelectric converter is electrically connected with the one of the source electrode and the drain electrode by the fourth via hole; and an orthographic projection of the third via hole on the substrate does not overlap with an orthographic projection of the fourth via hole on the substrate.

For example, in the flat panel detector provided by at least an embodiment of the present disclosure, an orthographic projection of the gate electrode layer on the substrate, an orthographic projection of the active layer on the substrate, an orthographic projection of the source electrode on the substrate, an orthographic projection of the drain electrode on the substrate, and the orthographic projection of the first photoelectric converter on the substrate do not coincide with each other.

For example, in the flat panel detector provided by at least an embodiment of the present disclosure, both the first photoelectric converter and the second photoelectric converter are PIN diodes.

For example, the flat panel detector provided by at least an embodiment of the present disclosure further comprises: a layer disposed on a side of the second photoelectric converter away from the substrate, and the layer comprises a scintillator.

For example, the flat panel detector provided by at least an embodiment of the present disclosure, further comprises a bias line, one of the source electrode of the thin film transistor and the drain electrode of the thin film transistor is electrically connected with the read signal line, and another one of the source electrode of the thin film transistor and the drain electrode of the thin film transistor is electrically connected with both the first upper electrode and the second lower electrode; one end of the first bias electrode is electrically connected with the first lower electrode, and another end of the first bias electrode is electrically connected with the bias line; one end of the second bias electrode is electrically connected with the second upper electrode, and another end of the second bias electrode is electrically connected with the bias line; and before a photoelectric conversion is performed, a first voltage difference is between the first upper electrode and the first lower electrode, a second voltage difference is between the second upper electrode and the second lower electrode, and the first voltage difference is equal to the second voltage difference.

For example, the flat panel detector provided by at least an embodiment of the present disclosure further comprises a first bias line and a second bias line, one of the source electrode of the thin film transistor and the drain electrode of the thin film transistor is electrically connected with the read signal line, and another one of the source electrode of the thin film transistor and the drain electrode of the thin film transistor is electrically connected with both the first upper electrode and the second lower electrode; one end of the first bias electrode is electrically connected with the first lower electrode, and another end of the first bias electrode is electrically connected with the first bias line; one end of the second bias electrode is electrically connected with the second upper electrode, and another end of the second bias electrode is electrically connected with the second bias line; and before and after a photoelectric conversion is performed, a first voltage difference is between the first upper electrode and the first lower electrode, and a second voltage difference is between the second upper electrode and the second lower electrode, and the first voltage difference is not equal to the second voltage difference.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
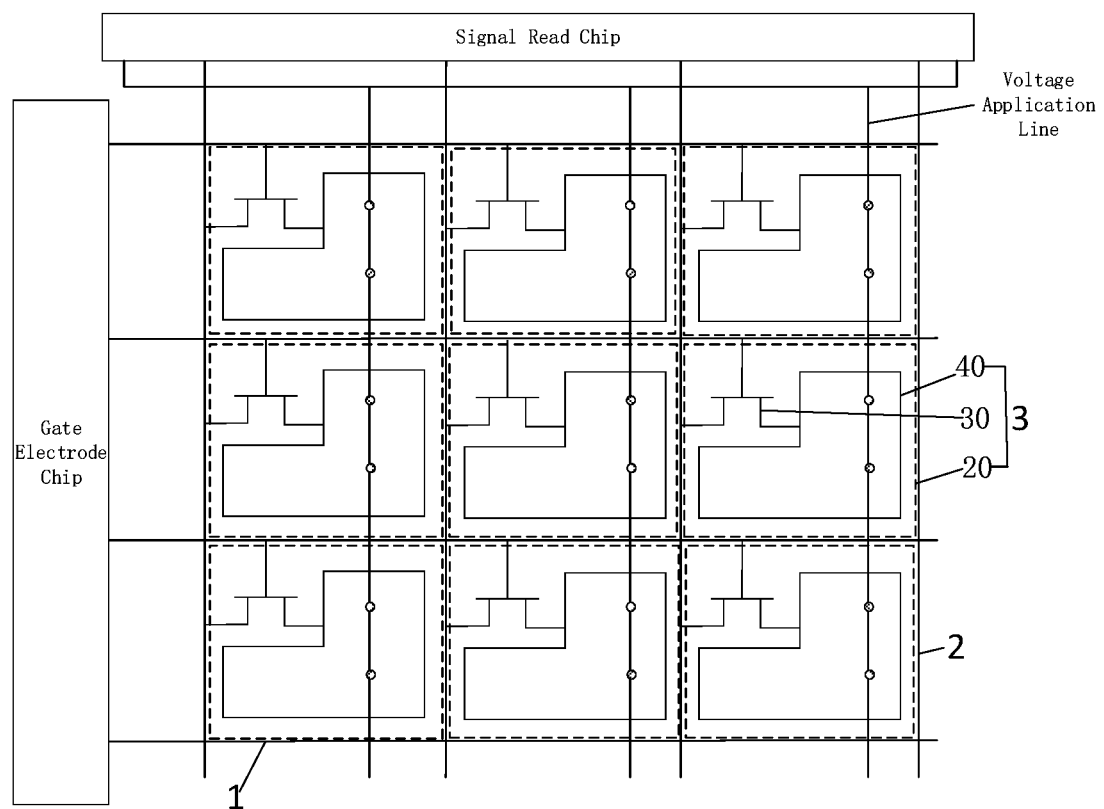
FIG. 1 is a top view of a flat panel detector provided by an embodiment of the present disclosure.

In order to make objects, technical details and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

In general, a flat panel X-ray detector (FPXD) includes a substrate, a plurality of detection units are provided on the substrate, each of the detection units includes a thin film transistor and a photodiode, the photodiode is on a side of the thin film transistor away from the substrate, the photodiode has a first electrode connected with a bias electrode and a second electrode connected with a source electrode of the thin film transistor or a drain electrode of the thin film transistor. In order to ensure a signal-to-noise ratio of the X-ray flat panel detector, it is necessary to reduce or eliminate overlapping capacitances and parasitic capacitances, therefore, in a case of designing the X-ray flat panel detector, it is required to reserve a large gap between the second electrode of the photodiode and each of a gate electrode layer of the thin film transistor, the source electrode of the thin film transistor, the drain electrode of the thin film transistor, a gate line and a read signal line, because an insulation layer between the second electrode of the photodiode and a group consisting of the read signal line, the thin film transistor and the gate line is relatively thin and a dielectric constant of the insulation layer is relatively large. If the gap is relatively small, a coupling capacitance between the second electrode of the photodiode and any one of the read signal line, the thin film transistor and the gate line is relatively large, therefore, the gap reduces the coupling capacitance and thus the noise is reduced. However, light may leak out from the gap between the gate electrode layer of the thin film transistor and the second electrode of the photodiode, the gap between the source electrode of the thin film transistor and the second electrode of the photodiode, the gap between the drain electrode of the thin film transistor and the second electrode of the photodiode, the gap between the gate line and the second electrode of the photodiode, and the gap between the read signal line and the second electrode of the photodiode, so that a large amount of visible light cannot be sensed by the photodiode, which reduces the sensitivity of the product.

The inventor of the present disclosure notes that two photoelectric converters may be provided, and light transmitted from the gap between the gate electrode layer of the thin film transistor and the second photoelectric converter, light transmitted from the gap between the source electrode of the thin film transistor and the second photoelectric converter, light transmitted from the gap between the drain electrode of the thin film transistor and the second photoelectric converter, light transmitted from the gap between the gate line and the second photoelectric converter, and light transmitted from the gap between the read signal line and the second photoelectric converter are absorbed by the first photoelectric converter located between the substrate and the thin film transistor. Alternatively, in the case where an electrode on a side of the second photoelectric converter close to the substrate is a transparent electrode, the first photoelectric converter can also absorb visible light that is not absorbed by the second photoelectric converter to further improve the utilization rate of visible light, and thus the sensitivity of the flat panel detector is improved.

At least one embodiment of the disclosure provides a flat panel detector, and the flat panel detector comprises: a substrate, a gate line and a read signal line that are on the substrate; the gate line and the read signal line are insulated from each other and intersecting each other to define a detection region; the detection region is provided with a detection unit, and the detection unit comprises a first photoelectric converter, a thin film transistor and a second photoelectric converter, the first photoelectric converter is on a side of the thin film transistor close to the substrate, the second photoelectric converter is on a side of the thin film transistor facing away from the substrate, and both the first photoelectric converter and the second photoelectric converter are electrically connected with the thin film transistor; a gate electrode layer of the thin film transistor is electrically connected with the gate line, and a source electrode of the thin film transistor or a drain electrode of the thin film transistor is electrically connected with the read signal line; a gap region is between an orthographic projection of the second photoelectric converter on the substrate and at least one selected from a group consisting of an orthographic projection of the gate line defining the detection unit on the substrate, an orthographic projection of the read signal line defining the detection unit on the substrate and an orthographic projection of the thin film transistor on the substrate, and an orthographic projection of the first photoelectric converter on the substrate at least covers the gap region. The plat panel detector improves the utilization rate of visible light, and thus the sensitivity of the flat panel detector is improved.

For example, FIG. 1 is a top view of a flat panel detector provided by an embodiment of the present disclosure. It is seen from FIG. 1, a plurality of gate lines 1 parallel to each other are insulated from a plurality of read signal lines 2 parallel to each other, and the plurality of the gate lines 1 intersect with the plurality of the read signal lines 2 to define a plurality of detection regions, each of the detection regions is provided with a detection unit 3; each detection unit 3 includes a first photoelectric converter 20 (for example, as represented by a dashed box in FIG. 1), a thin film transistor 30 and a second photoelectric converter 40, both the first photoelectric converter 20 and the second photoelectric converter 40 are electrically connected with the thin film transistor 30, for example, both the first photoelectric converter 20 and the second photoelectric converter 40 are electrically connected with a source electrode of the thin film transistor 30 or a drain electrode of the thin film transistor 30.

For example, in the top view illustrated in FIG. 1, a gap region is between the gate line 1 that defines a detection region and the second photoelectric converter 40, a gap region is between the read signal line 2 that defines a detection region and the second photoelectric converter 40, and a gap region is between the thin film transistor 30 and the second photoelectric converter 40, and it is seen from the top view as illustrated in FIG. 1, all the gap regions mentioned above are filled by the first photoelectric converter 20.

It should be noted that, in the top view illustrated in FIG. 1, in order to clearly show the region representing the first photoelectric converter 20, the dashed line frame is not overlapped with the solid line when drawing, but actually, a boundary of the dashed line frame representing the first photoelectric converter 20 may be overlapped with the solid line representing the gate line 1, the read signal line 2, and so on.

As illustrated in FIG. 1, the gate line 1 is electrically connected with a gate electrode chip, the read signal line 2 is electrically connected with a signal read chip, and electrical signals are respectively applied to the first photoelectric converter 20 and the second photoelectric converter 40 by a same voltage application line. For example, the same voltage application line is electrically connected with both the first photoelectric converter 20 and the second photoelectric converter 40 at different layers by a manner of via hole connection.

It should also be noted that, the electrical signals may also be respectively applied to the first photoelectric converter 20 and the second photoelectric converter 40 by different voltage application lines, and the specific arrangement refers to the descriptions in the following embodiments.

For example, in some embodiments, both the first photoelectric converter 20 and the second photoelectric converter 40 are PIN diodes. It is required that a potential of a P region of the PIN diode is lower than that of an N region of the PIN diode. Under irradiation of visible light, by applying a bias voltage to the bias electrode, the PIN diode generates photo-generated carriers, electrons move to P region, and holes move to N region. Under a certain amount of illumination, the electrons accumulate in the P region, and the holes accumulate in the N region, so that the potential of the P region drops, which allows the PIN diode to be in a reverse bias state to realize a normal operation.

Figure 2:
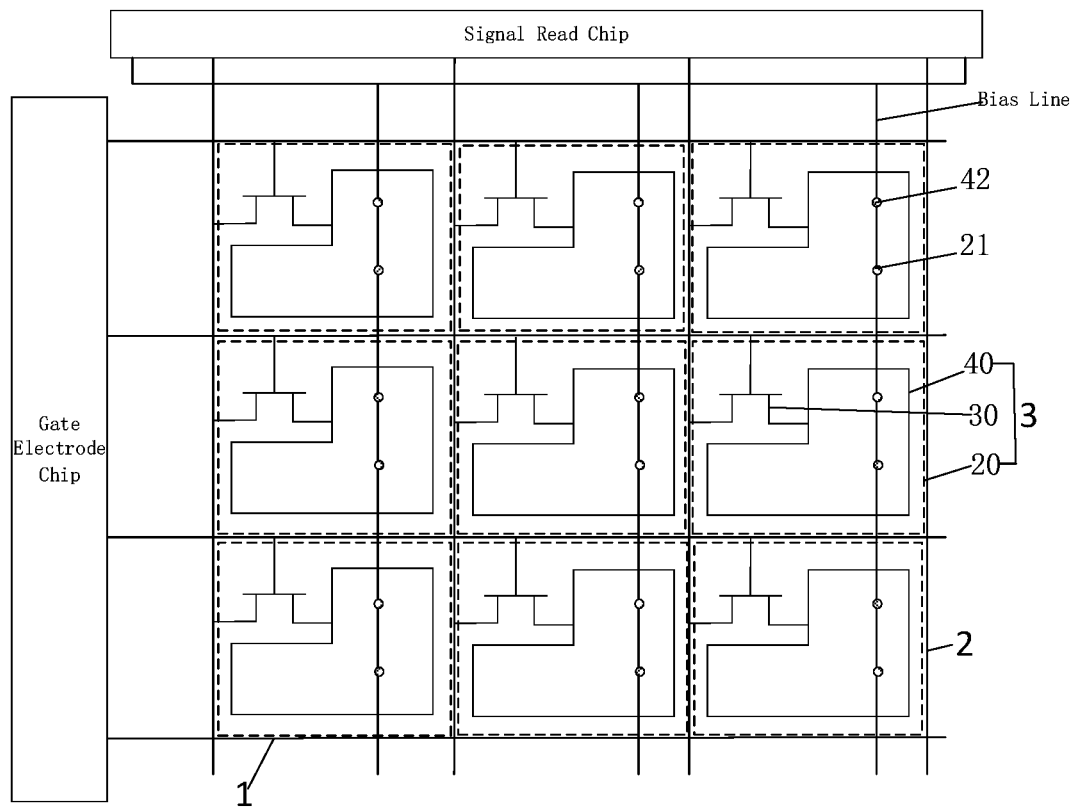
FIG. 2 is a top view of another flat panel detector provided by an embodiment of the present disclosure.
Figure 3:
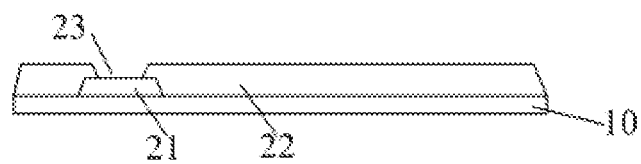
FIG. 3 is a schematic diagram of a formed first bias electrode provided by an embodiment of the present disclosure.
Figure 4:
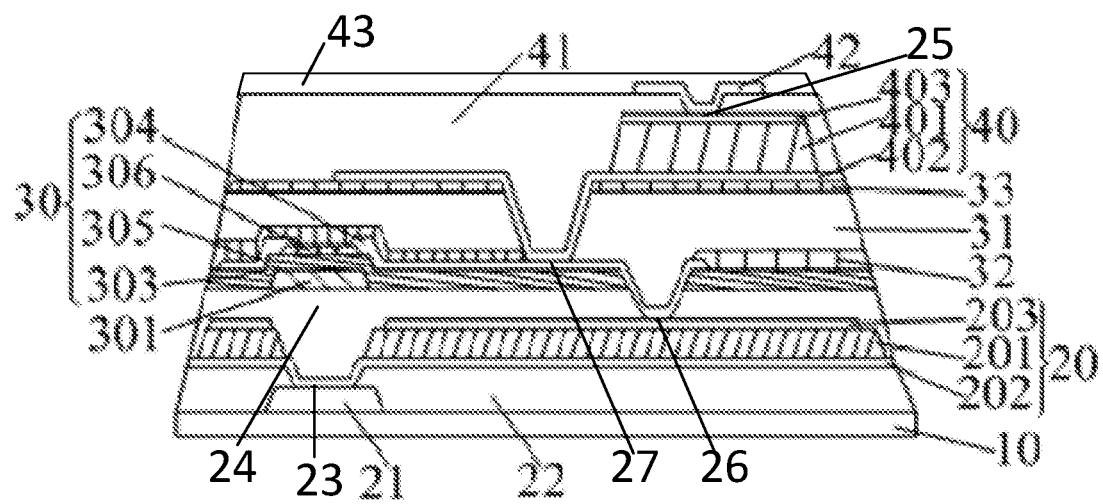
FIG. 4 is a schematic cross-sectional structure diagram of a single detection unit in a flat panel detector provided by an embodiment of the present disclosure.
Figure 5:
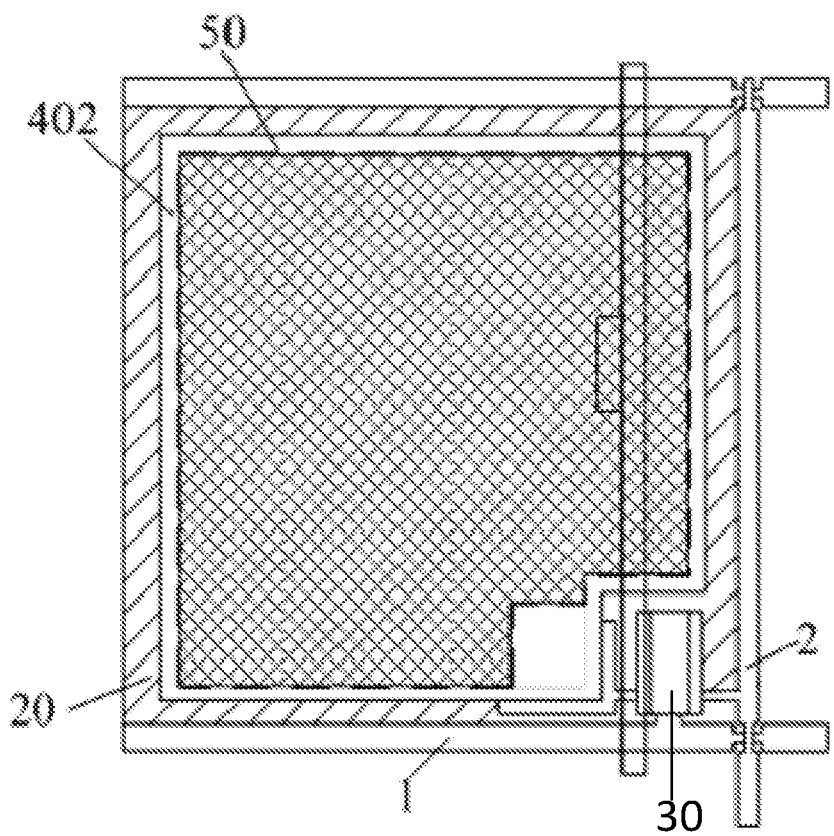
FIG. 5 is a schematic top view of a single detection unit of a flat panel detector provided by an embodiment of the present disclosure.

For example, FIG. 2 is a top view of another flat panel detector provided by an embodiment of the disclosure, and FIG. 3 is a schematic diagram of a formed first bias electrode provided by an embodiment of the disclosure. FIG. 4 is a schematic cross-sectional structural diagram of a single detection unit in a flat panel detector provided by an embodiment of the disclosure, and FIG. 5 is a schematic top view structural diagram of a single detection unit in a flat panel detector provided by an embodiment of the disclosure. As illustrated in FIG. 2 to FIG. 5, at least one embodiment of the present disclosure provides a flat panel detector, and the flat panel detector comprises a substrate 10, a plurality of gate lines 1 parallel to each other and a plurality of read signal lines 2 parallel to each other are formed on a side of the substrate 10, the gate lines 1 are insulated from the read signal lines 2, and the gate lines 1 intersect with the read signal lines 2 to define a plurality of detection regions, and each of the detection regions is provided with a detection unit 3; each detection unit 3 includes a first photoelectric converter 20, a thin film transistor 30 and a second photoelectric converter 40. The first photoelectric converter 20 is on a side of the thin film transistor 30 close to the substrate 10, and the second photoelectric converter 40 is on a side of the thin film transistor 30 facing away from the substrate 10. Both the first photoelectric converter 20 and the second photoelectric converter 40 are electrically connected with the thin film transistor 30, for example, both the first photoelectric converter 20 and the second photoelectric converter 40 are electrically connected with a source electrode 304 of the thin film transistor 30 or a drain electrode 305 of the thin film transistor 30. For example, in FIG. 4, both the first photoelectric converter 20 and the second photoelectric converter 40 are electrically connected with the source electrode 304 of the thin film transistor 30.

For example, a gap region is between an orthographic projection of the second photoelectric converter 40 on the substrate 10 and at least one selected from a group consisting of an orthographic projection of the gate line 1 defining the detection unit 3 on the substrate 10, an orthographic projection of the read signal line 2 defining the detection unit 3 on the substrate 10 and an orthographic projection of the thin film transistor 30 on the substrate 10, and an orthographic projection of the first photoelectric converter 20 on the substrate 10 at least covers the gap region, and as illustrated in FIG. 2, the orthographic projection of the first photoelectric converter 20 on the substrate 10 covers the gap region between the orthographic projection of the second photoelectric converter 40 on the substrate 10 and the orthographic projection of the gate line 1 defining the detection unit 3 on the substrate 10, the gap region between the orthographic projection of the second photoelectric converter 40 on the substrate 10 and the orthographic projection of the read signal line 2 defining the detection unit 3 on the substrate 10, and the gap region between the orthographic projection of the second photoelectric converter 40 on the substrate 10 and the orthographic projection of the thin film transistor 30 on the substrate 10.

It should be noted that, in the top view illustrated in FIG. 2, in order to clearly show the regions representing the first photoelectric converters 20, the dashed line frames representing the first photoelectric converters 20 are not overlapped with the solid lines in FIG. 2 in a case of drawing, but actually, the boundaries of the dashed line frames representing the first photoelectric converters 20 may be overlapped with the solid lines representing the gate lines 1, the read signal lines 2, and so on, so that the orthographic projections of the first photoelectric converters 20 on the substrate 10 covers all the gap regions between the orthographic projections of the gate lines 1 on the substrate 10 and the orthographic projections of the second photoelectric converters 40 on the substrate 10, all the gap regions between the orthographic projections of the read signal lines 2 on the substrate 10 and the orthographic projections of the second photoelectric converters 40 on the substrate 10, and so on.

For example, as illustrated in FIG. 2 to FIG. 5, visible light is irradiated onto the first photoelectric converters 20 and the second photoelectric converters 40, and the first photoelectric converters 20 and the second photoelectric converters 40 are used to convert visible light signals into electrical signals which are output as detection signals to the source electrodes 304 of the thin film transistors 30 while being converted into the electrical signals by the first photoelectric converters 20 and the second photoelectric converters 40. Each of the gate lines 1 is used to provide a scanning signal to the corresponding thin film transistor 30, and turns on the corresponding thin film transistor 30 in response to the gate line scanning signal, thereby transmitting the detection signals of the first photoelectric converter 20 and the second photoelectric converter 40 from the drain electrode 305 to the corresponding read signal line 2, and the corresponding read signal line 2 outputs the detection signals to an external data processing circuit.

For example, a gate electrode layer 301 of the thin film transistor 30 in each detection unit 3 is electrically connected with the gate line 1 defining a row of the detection region in which the respective thin film transistor 30 is located, and the source electrode 304 (or the drain electrode 305) of the thin film transistor 30 is electrically connected with the read signal line 2 defining a column of the detection region in which the respective thin film transistor 30 is located. For example, the source electrode 304 of the thin film transistor 30 and the drain electrode 305 of the thin film transistor 30 used in the embodiment of the present disclosure are symmetrical, so that the position of the source electrode 304 and the position of the drain electrode 305 may be interchanged. In a case that the source electrode 304 of the thin film transistor 30 is electrically connected with both the first photoelectric converter 20 and the second photoelectric converter 40, the drain electrode 305 of the thin film transistor 30 is electrically connected with the read signal line 2; alternatively, in a case that the drain electrode 305 of the thin film transistor 30 is electrically connected with both the first photoelectric converter 20 and the second photoelectric converter 40, the source electrode 304 of the thin film transistor 30 is electrically connected with the read signal line 2.

The embodiment of the present disclosure senses visible light transmitted from the gap regions between the orthographic projections of the gate lines 1 on the substrate 10 and the orthographic projections of the second photoelectric converters 40 on the substrate 10, visible light transmitted from the gap regions between the orthographic projections of the read signal lines 2 on the substrate 10 and the orthographic projections of the second photoelectric converters 40 on the substrate 10 by the first photoelectric converters 20, and visible light transmitted from the gap regions between the orthographic projections of the thin film transistors 30 on the substrate 10 and the orthographic projections of the second photoelectric converters 40 on the substrate 10, so that the visible light is fully utilized to improve the utilization rate of visible light and correspondingly improve the accuracy of reading data performed by the flat panel detector, that is, the sensitivity of the flat panel detector is improved, and in each detection unit, the first photoelectric converter 20 and the second photoelectric converter 40 are connected with the source electrode 304 (or the drain electrode 305) of the same thin film transistor 30, and thus a problem of signal crosstalk between the read signal line 2 and the source electrode 304 as well as the drain electrode 305 is effectively avoided.

For example, as illustrated in FIG. 2 and FIG. 3, the flat panel detector further includes a first bias electrode 21 on a side of the first photoelectric converter 20 close to the substrate 10 and a first insulation layer 22 between the first bias electrode 21 and the first photoelectric converter 20, and the first insulation layer 22 has a first via hole 23 exposing the first bias electrode 21.

For example, as illustrated in FIG. 4, the first photoelectric converter 20 includes a first photoelectric conversion layer 201, a first lower electrode 202 on a side of the first photoelectric conversion layer 201 close to the substrate 10, and a first upper electrode 203 on a side of the first photoelectric conversion layer 201 away from the substrate 10. The first lower electrode 202 is electrically connected with the first bias electrode 21 by the first via hole 23.

For example, as illustrated in FIG. 2 to FIG. 5, in a process of preparing the above-mentioned first photoelectric converter 20, the manufacturing method includes depositing a thin film and performing a patterning process on the thin film, so as to form a first photoelectric conversion layer 201 of the first photoelectric converter 20 and a first upper electrode 203 of the first photoelectric converter 20, and the first upper electrode 203 is etched into an island shape to ensure that all pixels are isolated from each other, otherwise the noise of the first photoelectric converter 20 is larger after signal crosstalk. For example, after forming a pixel matrix of m*n, it is necessary to connect l*m pixels in parallel with each other by a bias line (parallel to an extension direction of the read signal line 2) and the bias line is conducted to an outer region of an effective pixel region, then to connect n*1 leads in parallel, and a signal reading chip is responsible for power supply. An electrical signal is applied to the first bias electrode 21 by the bias line, and then the electrical signal is transmitted to the first lower electrode 202. In this way, the uniformity of the voltage applied to each of the pixels is ensured.

For example, as illustrated in FIG. 4, a second insulation layer 24 is provided on a side of the first upper electrode 203 away from the substrate 10. The second insulation layer 24 covers the first photoelectric converter 20 and separates the first photoelectric converter 20 from the thin film transistor 30.

For example, as illustrated in FIG. 4, the first bias electrode 21 is spaced apart from the first photoelectric converter 20 by the first insulation layer 22, the first photoelectric converter 20 is electrically connected with the first bias electrode 21 by the first via hole 23 in the first insulation layer 22, and a bias voltage is supplied to the first photoelectric converter 20 by the first bias electrode 21.

For example, as illustrated in FIG. 4, a material of the first upper electrode 203 is a transparent conductive material, which ensures that the first photoelectric conversion layer 201 is able to receive visible light.

For example, in some examples, the first photoelectric converter 20 is a PIN photodiode, and the first photoelectric conversion layer 201 is a first PIN layer.

For example, as illustrated in FIG. 2 to FIG. 5, taking a case that the thin film transistor 30 is a bottom gate type thin film transistor as an example, the thin film transistor 30 in each detection unit 3 includes a gate electrode layer 301 disposed on a side of the second insulation layer 24 away from the substrate 10, a gate insulation layer 303 disposed on a side of the gate electrode layer 301 away from the substrate 10, an active layer 306 disposed on a side of the gate insulation layer 303 away from the substrate 10, the source electrode 304 and the drain electrode 305 that are disposed on a side of the active layer 306 away from the substrate 10 and are respectively electrically connected with the active layer 306; and a material of the active layer 306 is a low-temperature polysilicon material.

For example, in the embodiment of the present disclosure, the active layer 306 is made of the low-temperature polysilicon material, so that the thin film transistor 30 made of the low-temperature polysilicon has higher charge mobility, and therefore, the thin film transistor 30 has good conductivity and electrical characteristics. In this case, it is not necessary to make a line width of each of the signal lines (the gate lines 1 and the read signal lines 2) electrically connected with the thin film transistors 30 be too large, and the normal turning on and turning off of the thin film transistor 30 can be controlled. Therefore, in the process of manufacturing the flat panel detector, the line width of each of the gate lines 1 and the line width of each of the read signal lines 2 can be appropriately reduced by a thin-line design, so that a shielding area of visible light by the gate lines 1 and the read signal lines 2 in the flat panel detector is reduced, an absorption area of the visible light of each of the detection units 3 in the flat panel detector is further increased, and the detection accuracy of visible light by each of the detection units 3 is higher.

For example, as illustrated in FIG. 4, the flat panel detector further includes a first passivation layer 32 located on a side of the active layer 306 away from the substrate 10, on a side of the source electrode 304 and the drain electrode 305 away from the substrate 10, and a fourth insulation layer 31 located between the first passivation layer 32 and the second photoelectric converter 40, and both the first passivation layer 32 and the fourth insulation layer 31 cover the active layer 306, the source electrode 304 and the drain electrode 305.

For example, the thin film transistor 30 is spaced apart from the second photoelectric converter 40 by the first passivation layer 32 and the fourth insulation layer 31. A surface of the fourth insulation layer 31 is flat, which facilitates the arrangement of the second photoelectric converter 40 to be formed later, and facilitates the electrical connection between the second photoelectric converter 40 and the source electrode 304 (or the drain electrode 305) of the thin film transistor 30, so that the reliability of metal interconnection is improved.

For example, as illustrated in FIG. 4, the flat panel detector further includes a third insulation layer 41 covering the second photoelectric converter 40, and a second bias electrode 42 located on a side of the second photoelectric converter 40 away from the substrate 10.

For example, the second photoelectric converter 40 includes a second photoelectric conversion layer 401, a second lower electrode 402 located on a side of the second photoelectric conversion layer 401 close to the substrate 10, and a second upper electrode 403 located on a side of the second photoelectric conversion layer 401 away from the substrate 10. A second via hole 25 exposing the second upper electrode 403 is provided in the third insulation layer 41, and the second bias electrode 42 is electrically connected with the second upper electrode 403 by the second via hole 25.

For example, as illustrated in FIG. 2 to FIG. 5, in the process of preparing the above-mentioned second photoelectric converter 40, the manufacturing method includes depositing a thin film and performing a patterning process on the thin film, so as to form a second photoelectric conversion layer 401 of the second photoelectric converter 40 and a second upper electrode 403 of the second photoelectric converter 40, and the second upper electrode 403 is etched into an island shape to ensure that all the pixels are spaced apart from each other, otherwise noise of the second photoelectric converter 40 is larger after signal crosstalk. For example, a same signal reading chip supplies power to the first photoelectric converter 20 and the second photoelectric converter 40, an electrical signal is applied to the first bias electrode 21 and the second bias electrode 42 through a same bias line, and then the electrical signal is respectively transmitted to the first lower electrode 202 and the second upper electrode 403. In this way, the uniformity of the voltage applied to each of the pixels is ensured.

It should be noted that, in the top view illustrated in FIG. 2, electrical signals are applied to the first bias electrode 21 and the second bias electrode 42 by the same bias line, which also simplifies the circuit structure of the flat panel detector, thereby saving the cost.

For example, as illustrated in FIG. 2 to FIG. 5, the first bias electrode 21 of the first photoelectric converter 20 and the second bias electrode 42 of the second photoelectric converter 40 are connected with a same bias line, one of the source electrode 304 of the thin film transistor 30 and the drain electrode 305 of the thin film transistor 30 (for example, the source electrode 304) is electrically connected with the read signal line 2, and another one of the source electrode 304 and the drain electrode 305 of the thin film transistor 30 (for example, the drain electrode 305) is electrically connected with both the first upper electrode 203 and the second lower electrode 402; one end of the first bias electrode 21 is electrically connected with the first lower electrode 202, and another end of the first bias electrode 21 is electrically connected with the bias line; one end of the second bias electrode 42 is electrically connected with the second upper electrode 403, and another end of the second bias electrode 42 is electrically connected with the bias line. In an initial state, that is, before a photoelectric conversion is performed, a first voltage difference is between the first upper electrode 203 and the first lower electrode 202, and a second voltage difference is between the second upper electrode 403 and the second lower electrode 402, and the first voltage difference is equal to the second voltage difference.

For example, after the photoelectric conversion is performed, the voltage input from the first photoelectric converter 20 to the source electrode 304 is different from the voltage input from the second photoelectric converter 40 to the source electrode 304 because of different materials and thicknesses respectively of the first photoelectric converter 201 in the first photoelectric converter 20 and the second photoelectric converter 401 in the second photoelectric converter 40, different amounts of visible light irradiation or different brightness of the visible light respectively received by the first photoelectric converter 201 and the second photoelectric converter 40.

For example, in FIG. 4, the drain electrode 305 of the thin film transistor 30 is electrically connected with the read signal line 2, and the source electrode 304 of the thin film transistor 30 is electrically connected with both the first upper electrode 203 and the second lower electrode 402, so that the electric signal transmitted to the source electrode 304 of the thin film transistor 30 is a superposition of the electric signals simultaneously transmitted from the first photoelectric converter 20 and the second photoelectric converter 40.

For example, as illustrated in FIG. 5, the region illustrated by the dashed frame 50 represents a region of both an orthographic projection of the second photoelectric conversion layer 401 on the substrate 10 and an orthographic projection of the second upper electrode 403 on the substrate 10, and a region of an orthographic projection of the second lower electrode 402 on the substrate 10 (the region enclosed by the dashed frame 50 and the blank region between the region outside the dashed frame and the region filled by the twill pattern) is larger than and includes the region enclosed by the dashed frame 50. The second photoelectric converter 40 absorbs more visible light because the region of the orthographic projection of the second photoelectric converter 40 on the substrate 10 is larger. A gap region is between a boundary of an orthographic projection of the second lower electrode 402 on the substrate 10 and a boundary of the orthographic projection of the gate line 1 on the substrate 10, a gap region is between the boundary of the orthographic projection of the second lower electrode 402 on the substrate 10 and the orthographic projection of the read signal line 2 on the substrate 10, and a gap region is between the boundary of the orthographic projection of the second lower electrode 402 on the substrate 10 and a boundary of the orthographic projection of the thin film transistor 30 on the substrate 10. The gap regions are illustrated in the twill pattern in FIG. 5. For example, as illustrated in FIG. 5, the first photoelectric converter 20 at least covers the region filled by the twill pattern.

For example, as illustrated in FIG. 4, in some examples, a third passivation layer 33 is further provided on a side of the fourth insulation layer 31 away from the substrate 10, and the third passivation layer 33 plays a role of further protecting the thin film transistor 30. Both a material of the first passivation layer 32 and a material of the third passivation layer 33 include one or more selected from a group consisting of silicon nitride, silicon oxide and silicon oxynitride, and the embodiments of the present disclosure are not limited to this.

For example, the first passivation layer 32 protects the active layer 306 made of low-temperature polysilicon material, which plays an anti-oxidation and anti-corrosion role. A fourth via hole 27 passes through both the fourth insulation layer 31 and the third passivation layer 33, and the second photoelectric converter 40 is electrically connected with the source electrode 304 of the thin film transistor 30 or the drain electrode 305 of the thin film transistor 30 by the fourth via hole 27. For example, in FIG. 4, the second photoelectric converter 40 is electrically connected with the source electrode 304 of the thin film transistor 30 by the fourth via hole 27.

For example, in some embodiments, the second photoelectric converter 40 is a PIN photodiode and the second photoelectric conversion layer 401 is a second PIN layer.

For example, in at least one embodiment of the present disclosure, as illustrated in FIG. 4, it is described by taking that the source electrode 304 of the thin film transistor 30 is electrically connected with the first photoelectric converter 20 and the second photoelectric converter 40, and the drain electrode 305 of the thin film transistor 30 is electrically connected with the read signal line 2 as an example. That is, a third via hole 26 exposing the first upper electrode 203 is provided in both the second insulation layer 24 and the gate insulation layer 303, and the source electrode 304 of the thin film transistor 30 is electrically connected with the first upper electrode 203 of the first photoelectric converter 20 by the third via hole 26; the fourth via hole 27 exposing the source electrode 304 of the thin film transistor 30 is provided in all the first passivation layer 32, the fourth insulation layer 31 and the third passivation layer 33, and the second lower electrode 402 of the second photoelectric converter 40 is electrically connected with the source electrode 304 of the thin film transistor 30 by the fourth via hole 27, so that the second photoelectric converter 40 is electrically connected with the source electrode 304 of the thin film transistor 30 by the fourth via hole 27, and thus the problem of electrical signal crosstalk between the read signal line 2 and the source electrode 304, and between the read signal line 2 and the drain electrode 305 is effectively avoided.

For example, as illustrated in FIG. 4, an orthographic projection of the third via hole 26 on the substrate 10 does not overlap with an orthographic projection of the fourth via hole 27 on the substrate 10, which effectively ensures that the second lower electrode 402 of the second photoelectric converter 40 is electrically connected with the source electrode 304 of the thin film transistor 30, and the first upper electrode 203 of the first photoelectric converter 20 is electrically connected with the source electrode 304 of the thin film transistor 30.

For example, as illustrated in FIG. 4, all of an orthographic projection of the gate electrode layer 301 on the substrate 10, an orthographic projection of the active layer 306 on the substrate 10, the orthographic projection of the source electrode 304 on the substrate 10 and the orthographic projection of the drain electrode 305 on the substrate 10 do not coincide with the orthographic projection of the first photoelectric converter 20 on the substrate 10, so as to reduce the risk of forming a coupling capacitance between the second photoelectric converter 40 and the source electrode 304, the risk of forming a coupling capacitance between the second photoelectric converter 40 and the drain electrode 305, and the risk of forming a coupling capacitance between the second photoelectric converter 40 and the active layer 306.

For example, in some embodiments, a material of the second lower electrode 402 is a transparent conductive material. For example, the material of the second lower electrode 402 is a transparent conductive metal material; for example, the material of the second lower electrode 402 is indium tin oxide (ITO) doped with a metal conductive substance, thereby reducing the resistivity of the second lower electrode 402, and light passing through the second lower electrode 402 can also be absorbed by the first photoelectric converter 20, so that the visible light is fully utilized, thereby improving the sensitivity of the flat panel detector.

For example, as illustrated in FIG. 4, the flat panel detector provided by the embodiment of the present disclosure further includes: a layer 43 disposed on the side of the second photoelectric converter 40 away from the substrate 10, and the layer 43 comprises a scintillator. Specifically, the layer 43 containing the scintillator is on a side of the third insulation layer 41 away from the substrate 10. The above-mentioned layer 43 containing the scintillator covers an upper surface of the second upper electrode 403 and an upper surface of the third insulation layer 41, and the layer 43 containing the scintillator can convert incident X-rays into visible light. The first photoelectric converter 20 and the second photoelectric converter 40 in the flat panel detector collect visible light irradiated to each detection unit 3, and convert the visible light into an electrical signal as a detection signal; the superposition of the detection signal generated by the first photoelectric converter 20 and the detection signal generated by the second photoelectric converter 40 is transmitted to the source electrode 304 of the thin film transistor 30, then by turning on the thin film transistor 30, the superposition of the detection signal generated by the first photoelectric converter 20 and the detection signal generated by the second photoelectric converter 40 is transmitted to the read signal line 2 by the drain electrode 305 of the thin film transistor 30, and then is output to a readout circuit.

Figure 6:
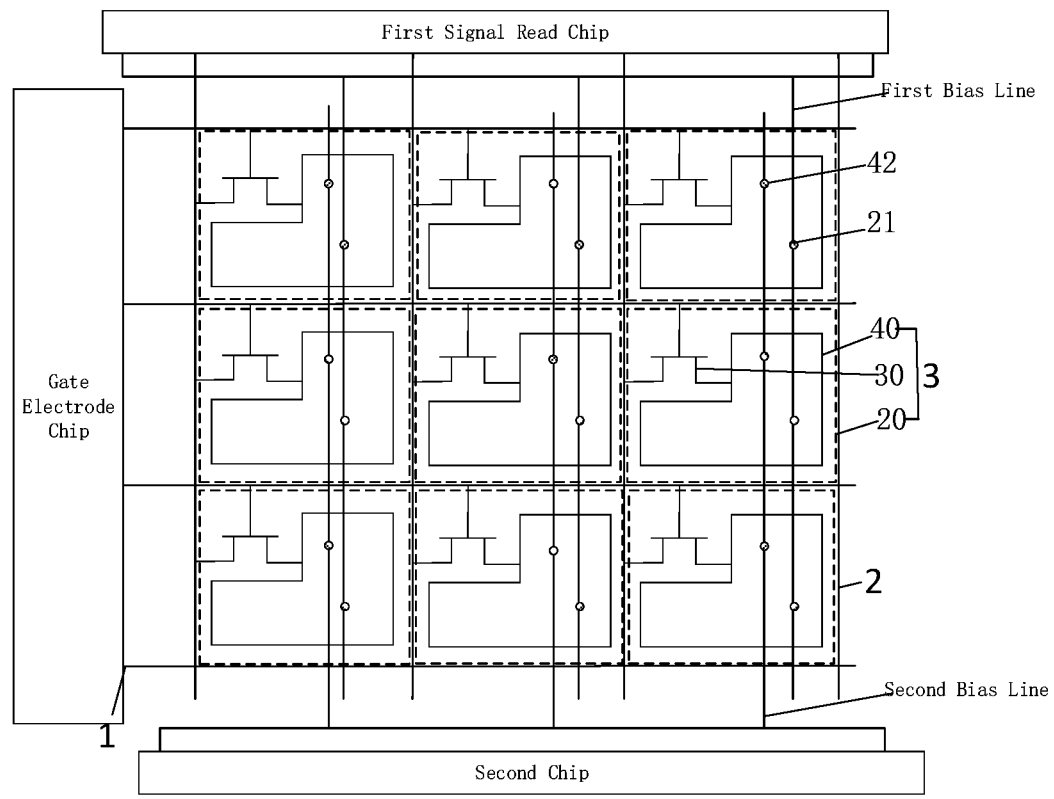
FIG. 6 is a top view of still another flat panel detector provided by an embodiment of the disclosure.

For example, FIG. 6 is a top view of still another flat panel detector provided by an embodiment of the present disclosure. As illustrated in FIG. 6, the flat panel detector includes a first bias line connected with the first bias electrode 21 and a first signal reading chip, and a second bias line connected with the second bias electrode 42 and a second chip. Both the first signal reading chip and the second chip are arranged in the outer region. The structure shown in FIG. 6 is different from the structure shown in FIG. 2 only in that the first bias electrode 21 and the second bias electrode 42 are connected with different bias lines and different chips, that is a first electrical signal is applied to the first bias electrode 21 by the first signal bias line and a second electrical signal is applied to the second bias electrode 42 by the second bias line. The schematic cross-sectional structure of the flat panel detector illustrated in FIG. 6 may refer to the relevant layer structure in FIG. 4.

Combining FIG. 6 and FIG. 4, the flat panel detector further includes the first bias line and the second bias line, one of the source electrode 304 of the thin film transistor 30 and the drain electrode 305 of the thin film transistor 30 is electrically connected with the read signal line 2, and another one of the source electrode 304 of the thin film transistor 30 and the drain electrode 305 of the thin film transistor 30 is electrically connected with both the first upper electrode 203 and the second lower electrode 402. One end of the first bias electrode 21 is electrically connected with the first lower electrode 202, and another end of the first bias electrode 21 is electrically connected with the first bias line. One end of the second bias electrode 42 is electrically connected with the second upper electrode 403, and another end of the second bias electrode 42 is electrically connected with the second bias line. In a case that the magnitude of the voltage applied from the first bias line to the first bias electrode 21 is different from the magnitude of the voltage applied from the second bias line to the second bias electrode 42, the first voltage difference between the first upper electrode 203 and the first lower electrode 202 is not equal to the second voltage difference between the second upper electrode 403 and the second lower electrode 402 before and after the photoelectric conversion is performed, in this way, by respectively applying different voltages to the first lower electrode 202 and the second upper electrode 403, photocurrent signals transmitted by the first photoelectric converter 20 and the second photoelectric converter 40 can be controlled separately, thereby enabling a wider adjustment range.

For example, the flat panel detector provided by at least one embodiment of the present disclosure enables visible light transmitted from the gap between the second photoelectric converter 40 and the thin film transistor 30, visible light transmitted from the gap between the second photoelectric converter 40 and the gate line 1, and visible light transmitted from the gap between the second photoelectric converter 40 and the read signal line 2 to be fully utilized by the first photoelectric converter 20, thereby improving the utilization rate of the visible light and further improving the sensitivity of the flat panel detector.

Figure 7:
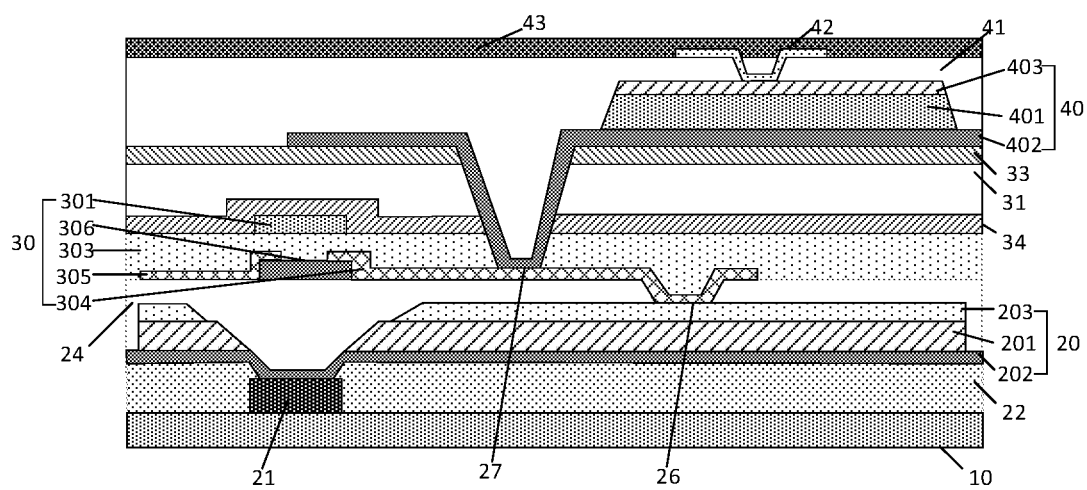
FIG. 7 is a schematic cross-sectional view of another single detection unit in a flat panel detector provided by embodiment of the present disclosure.

For example, FIG. 7 is a schematic cross-sectional structure diagram of another single detection unit in a flat panel detector provided by an embodiment of the present disclosure. The structure of the flat panel detector illustrated in FIG. 7 differs from that of the flat panel detector illustrated in FIG. 4 only in that the thin film transistor 30 in FIG. 4 is a bottom gate type thin film transistor and the thin film transistor 30 in FIG. 7 is a top gate type thin film transistor. For example, as illustrated in FIG. 7, the thin film transistor 30 includes the active layer 306 disposed on the side of the second insulation layer 24 away from the substrate 10, the source electrode 304 and the drain electrode 305 that are disposed on the side of the active layer 306 away from the substrate 10, the gate insulation layer 303 disposed on the side of the source electrode 304 and the drain electrode 305 away from the substrate 10, the gate electrode layer 301 disposed on the side of the gate insulation layer 303 away from the substrate 10; and the source electrode 304 and the drain electrode 305 are respectively electrically connected with the active layer 306.

For example, as illustrated in FIG. 7, the second insulation layer 24 is on the side of the first upper electrode 203 away from the substrate 10.

For example, as illustrated in FIG. 7, the flat panel detector further includes a second passivation layer 34 on the side of the gate electrode layer 301 away from the substrate 10, and the second passivation layer 34 covers the gate electrode layer 301.

For example, as illustrated in FIG. 7, the flat panel detector further includes a fourth insulation layer 31 and a third passivation layer 33 that are between the second passivation layer 34 and the second photoelectric converter 40.

For example, as illustrated in FIG. 7, a third via hole 26 exposing the first upper electrode 203 is provided in the second insulation layer 24, and the source electrode 304 (or the drain electrode 305) is electrically connected with the first upper electrode 203 of the first photoelectric converter 20 by the third via hole 26. A fourth via hole 27 exposing the source electrode 304 or the drain electrode 305 is provide in all the gate insulation layer 303, the second passivation layer 34, the fourth insulation layer 31 and the third passivation layer 33. The second lower electrode 402 of the second photoelectric converter 40 is electrically connected with the corresponding source electrode 304 (or the drain electrode 305) by the fourth via hole 27. An orthographic projection of the third via hole 26 on the substrate 10 does not overlap with an orthographic projection of the fourth via hole 27 on the substrate 10. For example, in FIG. 7, it is effectively ensured that the second lower electrode 402 of the second photoelectric converter 40 is electrically connected with the source electrode 304 of the thin film transistor 30, and the first upper electrode 203 of the first photoelectric converter 20 is electrically connected with the source electrode 304 of the thin film transistor 30.

For example, as illustrated in FIG. 7, the flat panel detector further includes the third insulation layer 41 covering the second photoelectric converter 40 and the second bias electrode 42 on the side of the second photoelectric converter 40 away from the substrate 10.

For example, as illustrated in FIG. 7, the flat panel detector further includes: the layer 43 containing the scintillator disposed on the side of the third insulation layer 41 away from the substrate 10, and the readout circuit electrically connected with the read signal line 2. The above-mentioned layer 43 containing the scintillator covers the upper surface of the second upper electrode 403 and the upper surface of the third insulation layer 41, and the layer 43 containing the scintillator can convert the incident X-rays into visible light. The first photoelectric converter 20 and the second photoelectric converter 40 in the flat panel detector collect visible light irradiated to each detection unit 3, and convert the visible light into an electrical signal as a detection signal; the detection signal generated by the first photoelectric converter 20 and the detection signal generated by the second photoelectric converter 40 can be output to the readout circuit by the read signal line.

For example, other structures and functions of the structure of the flat panel detector illustrated in FIG. 7 can refer to the related descriptions of the flat panel detector illustrated in FIG. 4, which are omitted herein.

At least one embodiment of the present disclosure provides a flat panel detector, and the flat panel detector has at least one of the following beneficial effects.

(1) In the flat panel detector provided by at least one embodiment of the present disclosure, by providing the first photoelectric converter and the second photoelectric converter, the first photoelectric converter located between the substrate and the thin film transistor absorbs light transmitted from the gap between the gate electrode layer of the thin film transistor and the second photoelectric converter, light transmitted from the gap between the source electrode of the thin film transistor and the second photoelectric converter, light transmitted from the gap between the drain electrode of the thin film transistor and the second photoelectric converter, light transmitted from the gap between the gate line and the second photoelectric converter, and the light transmitted from the gap between the read signal line and the second photoelectric converter, so as to improve the utilization rate of the visible light, thereby improving the sensitivity of the flat panel detector.

(2) In the flat panel detector provided by at least one embodiment of the present disclosure, in the case where the electrode of the second photoelectric converter on the side close to the substrate is a transparent electrode, the first photoelectric converter can also absorb light not absorbed by the second photoelectric converter to further improve the utilization rate of the visible light, thereby improving the sensitivity of the flat panel detector.

The following should be noted:

(1) The accompanying drawings involve only the structure(s) in connection with the embodiment(s) of the present disclosure, and other structure(s) can be referred to common design(s).

(2) For clarity, in accompanying drawings for illustrating the embodiment(s) of the present disclosure, the thickness of a layer or a structure may be enlarged or reduced. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, embodiments of the present disclosure and the features in the embodiments may be mutually combined to obtain new embodiments.

What have been described above are only specific implementations of the present disclosure, the protection scope of the present disclosure is not limited thereto. The protection scope of the present disclosure should be based on the protection scope of the claims.

What is claimed is:

1. A flat panel detector, comprising:
a substrate;
a gate line and a read signal line on the substrate, wherein the gate line and the read signal line are insulated from each other and intersecting each other to define a detection region;
the detection region is provided with a detection unit, and the detection unit comprises a first photoelectric converter, a thin film transistor and a second photoelectric converter, the first photoelectric converter is on a side of the thin film transistor close to the substrate, the second photoelectric converter is on a side of the thin film transistor facing away from the substrate, and both the first photoelectric converter and the second photoelectric converter are electrically connected with the thin film transistor;
a gate electrode layer of the thin film transistor is electrically connected with the gate line, and a source electrode of the thin film transistor or a drain electrode of the thin film transistor is electrically connected with the read signal line;
a gap region is between an orthographic projection of the second photoelectric converter on the substrate and at least one selected from a group consisting of an orthographic projection of the gate line defining the detection unit on the substrate, an orthographic projection of the read signal line defining the detection unit on the substrate and an orthographic projection of the thin film transistor on the substrate, wherein an orthographic projection of the first photoelectric converter on the substrate at least covers the gap region.

2. The flat panel detector according to claim 1, further comprising: a first bias electrode on a side of the first photoelectric converter close to the substrate; and a first insulation layer between the first bias electrode and the first photoelectric converter, wherein the first insulation layer has a first via hole exposing the first bias electrode.

3. The flat panel detector according to claim 2, wherein the first photoelectric converter comprises a first photoelectric conversion layer, a first lower electrode on a side of the first photoelectric conversion layer close to the substrate, and a first upper electrode on a side of the first photoelectric conversion layer away from the substrate, and the first lower electrode is electrically connected with the first bias electrode by the first via hole.

4. The flat panel detector according to claim 3, wherein a material of the first upper electrode is a transparent conductive material.

5. The flat panel detector according to claim 3, further comprises a second insulation layer on a side of the first upper electrode away from the substrate.

6. The flat panel detector according to claim 5, wherein the thin film transistor further comprises:
a gate insulation layer on a side of the gate electrode layer away from the substrate;
an active layer on a side of the gate insulation layer away from the substrate,
wherein the gate electrode layer is on a side of the second insulation layer away from the substrate;
both the source electrode and the drain electrode are on a side of the active layer away from the substrate, and the source electrode and the drain electrode are respectively electrically connected with the active layer.

7. The flat panel detector according to claim 6, further comprising: a first passivation layer on the side of the active layer away from the substrate and on a side of the source electrode and the drain electrode away from the substrate, wherein the first passivation layer covers all the active layer, the source electrode and the drain electrode.

8. The flat panel detector according to claim 7, further comprising: a fourth insulation layer between the first passivation layer and the second photoelectric converter, and a third passivation layer between the fourth insulation layer and the second photoelectric converter.

9. The flat panel detector according to claim 8, wherein
a third via hole exposing the first upper electrode is in both the second insulation layer and the gate insulation layer, and one of the source electrode and the drain electrode is electrically connected with the first upper electrode of the first photoelectric converter by the third via hole;
a fourth via hole exposing the one of the source electrode and the drain electrode is in both the fourth insulation layer and the third passivation layer, and the second lower electrode of the second photoelectric converter is electrically connected with the one of the source electrode and the drain electrode by the fourth via hole; and
an orthographic projection of the third via hole on the substrate does not overlap with an orthographic projection of the fourth via hole on the substrate.

10. The flat panel detector according to claim 5, wherein the thin film transistor further comprises:
an active layer on a side of the second insulation layer away from the substrate; and a gate insulation layer on a side of both the source electrode and the drain electrode away from the substrate, wherein both the source electrode and the drain electrode are on a side of the active layer away from the substrate;

the gate electrode layer is on a side of the gate insulation layer away from the substrate; and the source electrode and the drain electrode are respectively electrically connected with the active layer.

11. The flat panel detector according to claim 10, further comprising: a second passivation layer on a side of the gate electrode layer away from the substrate, wherein the second passivation layer covers the gate electrode layer.

12. The flat panel detector according to claim 11, further comprising: a fourth insulation layer and a third passivation layer that are between the second passivation layer and the second photoelectric converter.

13. The flat panel detector according to claim 12, wherein a third via hole exposing the first upper electrode is in the second insulation layer, and one of the source electrode and the drain electrode is electrically connected with the first upper electrode of the first photoelectric converter by the third via hole;

a fourth via hole exposing the one of the source electrode and the drain electrode is in all the gate insulation layer, the second passivation layer, the fourth insulation layer and the third passivation layer, and the second lower electrode of the second photoelectric converter is electrically connected with the one of the source electrode and the drain electrode by the fourth via hole; and an orthographic projection of the third via hole on the substrate does not overlap with an orthographic projection of the fourth via hole on the substrate.

14. The flat panel detector according to claim 10, wherein an orthographic projection of the gate electrode layer on the substrate, an orthographic projection of the active layer on the substrate, an orthographic projection of the source electrode on the substrate, an orthographic projection of the drain electrode on the substrate, and the orthographic projection of the first photoelectric converter on the substrate do not coincide with each other.

15. The flat panel detector according to claim 2, further comprising:

a third insulation layer covering the second photoelectric converter; and a second bias electrode on a side of the second photoelectric converter away from the substrate, wherein the second photoelectric converter comprises a second photoelectric conversion layer, a second lower electrode on a side of the second photoelectric conversion layer close to the substrate, and a second upper electrode on a side of the second photoelectric conversion layer away from the substrate, the third insulation layer has a second via hole exposing the second upper electrode, and the second bias electrode is electrically connected with the second upper electrode by the second via hole.

16. The flat panel detector according to claim 15, wherein a material of the second lower electrode is a transparent conductive material.

17. The flat panel detector according to claim 15, further comprising a bias line, wherein one of the source electrode of the thin film transistor and the drain electrode of the thin film transistor is electrically connected with the read signal line, and another one of the source electrode of the thin film transistor and the drain electrode of the thin film transistor is electrically connected with both the first upper electrode and the second lower electrode;

one end of the first bias electrode is electrically connected with the first lower electrode, and another end of the first bias electrode is electrically connected with the bias line;

one end of the second bias electrode is electrically connected with the second upper electrode, and another end of the second bias electrode is electrically connected with the bias line; and before a photoelectric conversion is performed, a first voltage difference is between the first upper electrode and the first lower electrode, a second voltage difference is between the second upper electrode and the second lower electrode, and the first voltage difference is equal to the second voltage difference.

18. The flat panel detector according to claim 15, further comprising a first bias line and a second bias line, wherein one of the source electrode of the thin film transistor and the drain electrode of the thin film transistor is electrically connected with the read signal line, and another one of the source electrode of the thin film transistor and the drain electrode of the thin film transistor is electrically connected with both the first upper electrode and the second lower electrode;

one end of the first bias electrode is electrically connected with the first lower electrode, and another end of the first bias electrode is electrically connected with the first bias line;

one end of the second bias electrode is electrically connected with the second upper electrode, and another end of the second bias electrode is electrically connected with the second bias line; and before and after a photoelectric conversion is performed, a first voltage difference is between the first upper electrode and the first lower electrode, and a second voltage difference is between the second upper electrode and the second lower electrode, and the first voltage difference is not equal to the second voltage difference.

19. The flat panel detector according to claim 1, wherein both the first photoelectric converter and the second photoelectric converter are PIN diodes.

20. The flat panel detector according to claim 1, further comprising: a layer disposed on a side of the second photoelectric converter away from the substrate, wherein the layer comprises a scintillator.

* * * * *